(12) United States Patent
Kamiyama et al.

(10) Patent No.: US 7,732,826 B2
(45) Date of Patent: Jun. 8, 2010

(54) SEMICONDUCTOR AND METHOD OF SEMICONDUCTOR FABRICATION

(76) Inventors: Satoshi Kamiyama, c/o Meijo University, 1-501, Shiogamaguchi, Tempaku-ku, Nagoya-shi, Aichi, 468-8502 (JP); Hiroshi Amano, c/o Meijo University, 1-501, Shiogamaguchi, Tempaku-ku, Nagoya-shi, Aichi, 468-8502 (JP); Isamu Akasaki, c/o Meijo University, 1-501, Shiogamaguchi, Tempaku-ku, Nagoya-shi, Aichi, 468-8502 (JP); Motoaki Iwaya, c/o Meijo University, 1-501, Shiogamaguchi, Tempaku-ku, Nagoya-shi, Aichi, 468-8502 (JP); Hiroyuki Kinoshita, c/o Meijo University, 1-501, Shiogamaguchi, Tempaku-ku, Nagoya-shi, Aichi, 468-8502 (JP)

(*) Notice: Subject to any disclaimer, the term of this patent is extended or adjusted under 35 U.S.C. 154(b) by 375 days.

(21) Appl. No.: 11/603,977

(22) Filed: Nov. 21, 2006

(65) Prior Publication Data

US 2007/0114560 A1 May 24, 2007

(30) Foreign Application Priority Data

Nov. 24, 2005 (JP) ............................ 2005-339531

(51) Int. Cl.
*H01L 33/00* (2010.01)

(52) U.S. Cl. .......................... 257/94; 257/96; 257/97; 257/103; 257/101

(58) Field of Classification Search ................... 257/13, 257/15, 22, 94, 96, 101, 103
See application file for complete search history.

(56) References Cited

U.S. PATENT DOCUMENTS

| 5,677,553 | A  | * | 10/1997 | Yamamoto et al. | .......... 257/192 |
| 2002/0195606 | A1 |  | 12/2002 | Edmond et al. | |
| 2004/0004223 | A1 |  | 1/2004 | Nagahama et al. | |
| 2004/0016932 | A1 | * | 1/2004 | Kondo | ........................ 257/80 |
| 2007/0176531 | A1 | * | 8/2007 | Kinoshita et al. | ........... 313/486 |

FOREIGN PATENT DOCUMENTS

| EP | 1560275 | 8/2005 |
| GB | 2428681 | 2/2007 |
| WO | WO2005/090515 | 9/2005 |

OTHER PUBLICATIONS

The extended European search report, pursuant to Rule 44a EPC dated Apr. 16, 2007, searched on Mar. 19, 2007.
Nitride-Based LEDS With Modulation-Doped AL0.12GA0.88N-GAN Superlattice Structures.
The European examination dated Feb. 25, 2009.
Heikman S, et al: "High Conductivity modulation doped AlGaN/GaN multiple channel heterostructures".

* cited by examiner

*Primary Examiner*—Ida M Soward
*Assistant Examiner*—Telly D Green

(57) ABSTRACT

The present invention discloses a semiconductor, includes one or more luminescent layers; and one or more electron gas layers with two-dimensional electron gases that are distributed parallel to the luminescent layers.

8 Claims, 6 Drawing Sheets

SEMICONDUCTOR AND METHOD OF SEMICONDUCTOR FABRICATION

CROSS-REFERENCES TO RELATED APPLICATIONS

The present application is related to the Japanese Patent Application No. 2005-339531, filed on Nov. 24, 2005, the entire disclosure of which is expressly incorporated by reference herein.

BACKGROUND OF THE INVENTION (1) Field of the Invention

The present invention relates to semiconductors, and more particularly, to a method of semiconductor fabrication.

(2) Description of Related Art

In recent years, light-emitting diodes have come into widespread use as light-emitting devices formed using compound semiconductors, and have been used primarily in optical data transmission, in special illumination equipment, and similar. In addition, white-light light-emitting diodes, which cause a blue-light light-emitting diode using a nitride semiconductor to emit blue light, and passes this blue light through a YAG (Yttrium Aluminum Garnet)—based yellow phosphor to generate white light, have been put into use (see for example Japanese Patent Laid-open No. 2005-268770).

In such a configuration, YAG-based yellow phosphors are formed by covering the light-emitting layer with a resin into which is intermixed the YAG-based yellow phosphor powder. In the YAG-based yellow phosphor, a portion of the blue light is converted into yellow light. Through color mixing of the converted yellow light with the unconverted blue light, white light can be obtained. Such a white-light light-emitting diode can be formed in large chip sizes to enable use in ordinary illumination and other areas, and a variety of different applications are anticipated.

However, there has been the problem that, when the intermixed concentration of the YAG-based yellow phosphor is not uniform, the output color is uneven. That is, in portions in which the concentration of the YAG-based yellow phosphor is low, the color is bluish, and in portions in which the concentration of the YAG-based yellow phosphor is high, the color is yellowish, and so there is the problem that the color is uneven. Further, there has been the problem that, when the film thickness of the resin into which the YAG-based yellow phosphor powder is intermixed is uneven, the output color is uneven. Such color unevenness is more prominent for larger chip sizes, and so it has been difficult to use YAG-based yellow phosphors in general-purpose illumination lamps.

On the other hand, SiC phosphors in which SiC crystals are doped with acceptor impurities and donor impurities have been proposed (see International Patent Publication No. 2005/090515). In this configuration, through stimulation by near-ultraviolet light emitted from a near-ultraviolet light-emitting diode or similar, donor electrons and acceptor holes can recombine, and the energy transition upon this recombination results in fluorescence. Because the wavelength of this fluorescence depends on the energy gap between the donor level and the acceptor level, by appropriately choosing the elements introduced as the acceptor impurities and donor impurities, fluorescence at an arbitrary color can be induced.

In International Patent Publication No. 2005/090515, by providing a two-layer SiC phosphor in which SiC crystals are respectively doped with boron and aluminum as acceptor impurities, to induce yellow and blue fluorescence, by mixing of these fluorescent colors, white light is obtained. In the process of light-emitting diode layering from an SiC substrate, SiC phosphors can easily be formed, the film thickness and impurity concentrations can easily be controlled so as to be uniform, and satisfactory color uniformity can be achieved.

However, there has been the problem that, even if the SiC phosphor is formed uniformly, when the current supplied to the light emission layer is uneven, the light emission amount is uneven. In particular, if the chip size is increased, it becomes impossible to supply a uniform current to the light emission layer, and so it is difficult to use such a light-emitting diode in general-purpose illumination and similar. Further, it has been necessary to extend electrodes over the entire chip in order to enable the uniform supply of current to the light emission layer. In particular, as a result of forming an electrode on the side of the light extraction face, there are the problems that the efficiency of light extraction is decreased by the electrode extending over the entire chip, and that a transparent electrode must be used.

BRIEF SUMMARY OF THE INVENTION

The present invention discloses a semiconductor, comprising: one or more luminescent layers; and one or more electron gas layers with two-dimensional electron gases that are distributed parallel to the luminescent layers.

An optional aspect of the present invention provides a semiconductor wherein: the one or more luminescent layers are comprised of a nitride.

Another optional aspect of the present invention provides a semiconductor wherein: the one or more electron gas layers are comprised of an AlGaN/GaN hetero structure.

Another optional aspect of the present invention provides a semiconductor a wherein: a concentration of impurities in the AlGaN/GaN hetero structure is smaller than $10^{16}$ cm$^{-3}$.

An optional aspect of the present invention provides a semiconductor wherein: two or more of the electron gas layers are layered.

Another optional aspect of the present invention provides a semiconductor wherein: the one or more luminescent layers and the one or more electron gas layers are layered on an SiC substrate.

An optional aspect of the present invention provides a semiconductor wherein: a total thickness of semiconductor layers layered on the SiC substrate including the one or more luminescent layers and the one or more electron gas layers is smaller than 3.5 micro meters.

Another optional aspect of the present invention provides a semiconductor wherein: the SiC substrate includes one or more couples of an acceptor impurity and a donor impurity.

The present invention provides a method for semiconductor device fabrication, comprising the acts of:
  forming a first semiconductor layer;
  forming a second semiconductor layer on the first semiconductor layer;
  forming a buffer layer on the second semiconductor layer;
  forming an electron gas layer on the buffer layer;
  forming a first contact layer on the electron gas layer;
  forming a first cladding layer on the first contact layer;
  forming a multiple quantum well active layer on the first cladding layer;
  forming an electron blocking layer on the multiple quantum well active layer;
  forming a second cladding layer on the multiple quantum well active layer;
  forming a second contact layer on the second cladding layer;

forming a p-electrode on the second contact layer;

etching a prescribed region of layers to expose a surface of the first contact layer;

forming a n-electrode on the exposed surface of the first contact layer.

An optional aspect of the present invention provides a method for semiconductor device fabrication, wherein:

the prescribed region is etched to form an interdigital configuration.

Another optional aspect of the present invention provides a method for semiconductor device fabrication, wherein:

the electron gas layer is comprised of alternative well and barrier layers, placed along a thickness direction of the semiconductor device, forming a periodic structure within the electron gas layer.

The present invention discloses a method for fabricating a semiconductor, comprising: providing one or more luminescent layers; and providing one or more electron gas layers with two-dimensional electron gases that are distributed parallel to the luminescent layers.

These and other features, aspects, and advantages of the invention will be apparent to those skilled in the art from the following detailed description of preferred non-limiting exemplary embodiments, taken together with the drawings and the claims that follow.

BRIEF DESCRIPTION OF THE DRAWINGS

It is to be understood that the drawings are to be used for the purposes of exemplary illustration only and not as a definition of the limits of the invention. Throughout the disclosure, the word "exemplary" is used exclusively to mean "serving as an example, instance, or illustration." Any embodiment described as "exemplary" is not necessarily to be construed as preferred or advantageous over other embodiments.

DETAILED DESCRIPTION OF THE INVENTION (1) Structure of White-Light Light-Emitting Diodes FIG. 1 is an exemplary schematic diagram showing the structure of a light-emitting diode, as the semiconductor of a first embodiment. In the figure, the white-light light-emitting diode 10 includes a SiC fluorescent substrate 11; SiC fluorescent layer 12; buffer layer 13; electron gas layer 14; first contact layer 15; first cladding layer 16; multiple quantum well active layer 17; electron blocking layer 18; second cladding layer 19; second contact layer 20; p electrode 21; and n electrode 22. These portions 10, 11, 12, 13, 14, 15, 16, 17, 18, 19, 20, 21 and 22 are formed as layers.

Figure 1:
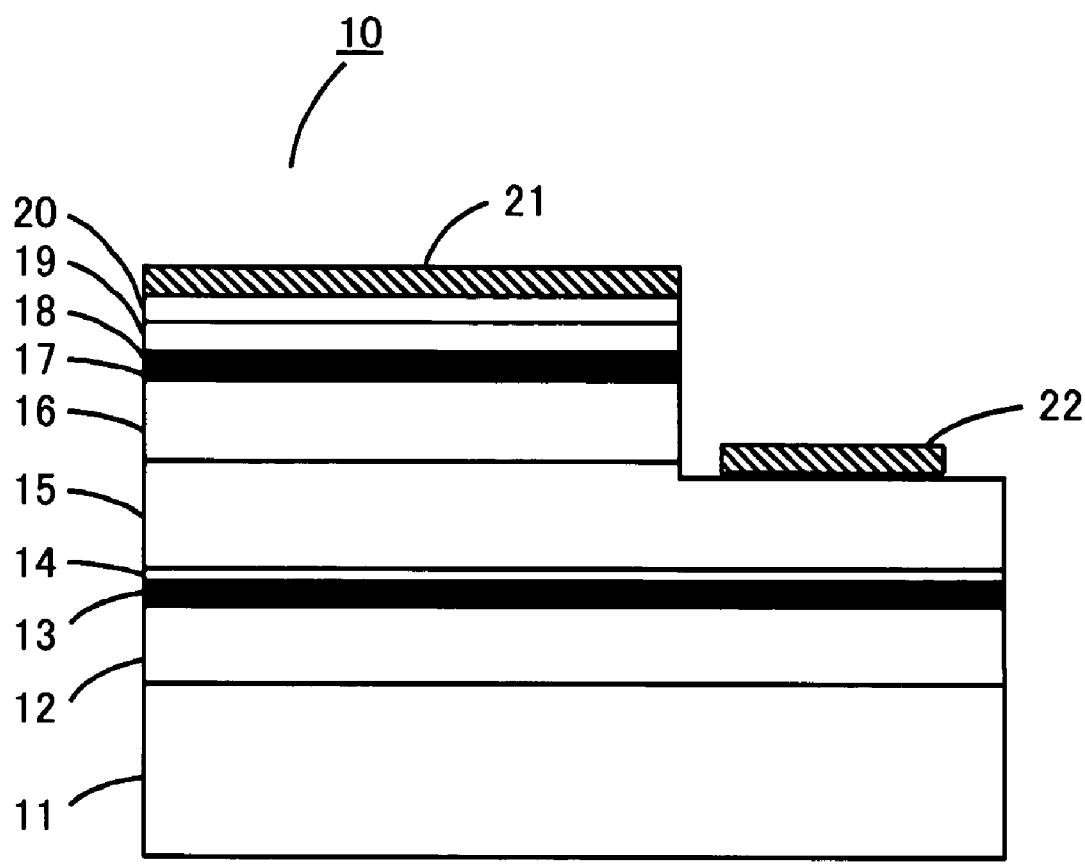
FIG. 1 is an exemplary schematic diagram showing the structure of a light-emitting diode of a first embodiment.

The SiC fluorescent substrate 11 is comprised of a 6H-type SiC crystal with periodic structures repeating every six layers. The SiC fluorescent layer 11 comprises boron (B) as an acceptor impurity and nitrogen (N) as a donor impurity. The concentration of boron comprised in the SiC fluorescent substrate 11 is approximately $2\times10^{18}$ cm$^{-3}$, and the concentration of nitrogen comprised in the SiC fluorescent substrate 11 is approximately $3\times10^{18}$ cm$^{-3}$. These impurities are distributed substantially uniformly in the SiC fluorescent substrate 11. The SiC fluorescent layer 12 is layered in thin film form on the SiC fluorescent substrate 11. The SiC fluorescent layer 12 has a 6H-type SiC crystal structure. The SiC fluorescent layer 12 comprises aluminum (Al) as the acceptor impurity and nitrogen as the donor impurity. The concentrations of the acceptor impurity and the donor impurity are approximately $2\times10^{18}$ cm$^{-3}$ and $3\times10^{18}$ cm$^{-3}$ respectively.

Because the crystal structure of the SiC fluorescent layer 12 and that of the SiC fluorescent substrate 11 are same, the SiC fluorescent layer 12 can grown by non-limiting exemplary method of using a close-spaced sublimation. By appropriately adjusting the partial pressure of nitrogen gas N2 in the atmosphere during crystal growth, the SiC fluorescent layer 12 can be doped with nitrogen to a nitrogen concentration of $3\times10^{18}$ cm$^{-3}$. In the case of aluminum by intermixing an appropriate amount of either elemental aluminum or an aluminum compound into the raw material, the SiC fluorescent layer 12 can be doped with aluminum such that the aluminum concentration is $2\times10^{18}$ cm$^{-3}$.

A buffer layer 13 comprising AlGaN is grown on the SiC fluorescent layer 12 by non-limiting exemplary method of using a metallorganic vapor phase growth. On the buffer layer 13 the metallorganic vapor phase growth method is non-limiting exemplary used in continuous growth of an electron gas layer 14 comprising GaN. The thickness of the electron gas layer 14 is from 1 nm to 50 nm. In the metallorganic vapor phase growth method, a metallorganic compound having direct bonds with carbon atoms is used as the raw material with non-limiting exemplary gas carries such as hydrogen, nitrogen or the like. Accordingly, epitaxial growth can be performed. The metallorganic vapor phase growth method is used in continuous growth of the first contact layer 15 comprising n-GaN, the first cladding layer 16 comprising n-AlGaN, the multiple quantum well active layer 17 comprising GaInN/GaN, the electron blocking layer 18 comprising p-AlGaN, the second cladding layer 19 comprising p-AlGaN and the second contact layer 20 comprising p-GaN. The p electrode 21 made of Ni/Au is layered on the surface of the second contact layer 20.

By etching in the thickness direction in a prescribed region from the second contact layer 20 to midway through the first contact layer 15, the surface of the first contact layer 15 is exposed. The n electrode 22 is formed at the exposed site of the first contact layer 15. The total thickness of the semiconductor layers 12, 13, 14, 15, 16, 17, 18, 19 and 20 formed on the SiC fluorescent substrate 11 is set to less than 2.5 µm, in order that cracks do not occur. The film thickness of the first contact layer 15 is approximately 2.0 µm.

Figure 2:
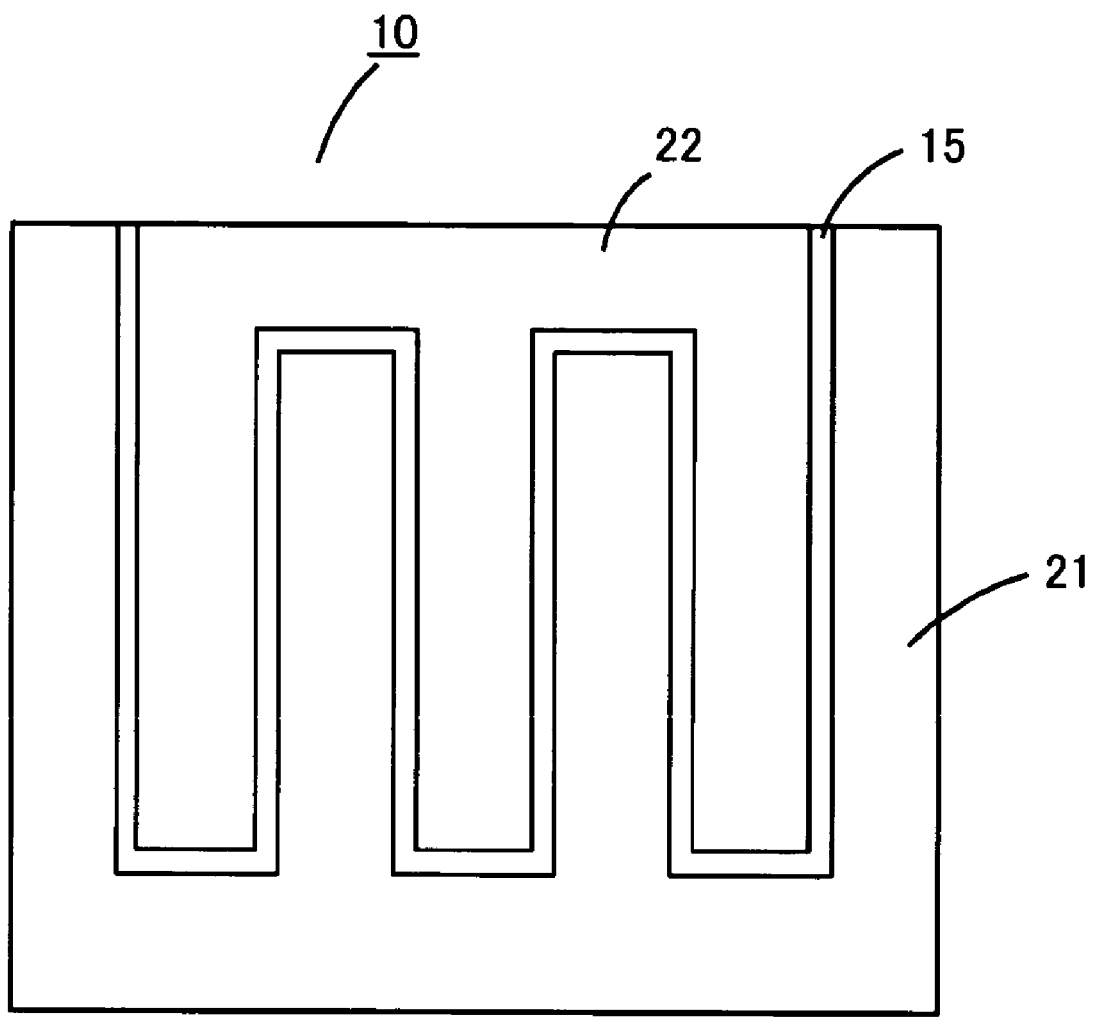
FIG. 2 is an exemplary plane view of a light-emitting diode.

FIG. 2 shows an exemplary top view of the white-light light-emitting diode 10. In the figure, the p electrode 21 and n electrode 22 are formed in an interdigital shape. By etching from the second contact layer 20 to midway through the first contact layer 15 in an interdigital shape, the first contact layer 15 is exposed in an interdigital shape. And the interdigital-shape n electrode 22 is formed at the exposed sites. On the other hand, because sites which are not etched also have an interdigital shape, the interdigital-shape p electrode 21 can be formed on the remaining second contact layer 20.

(2) Energy Profile of Electron Gas Layer

Figure 3:
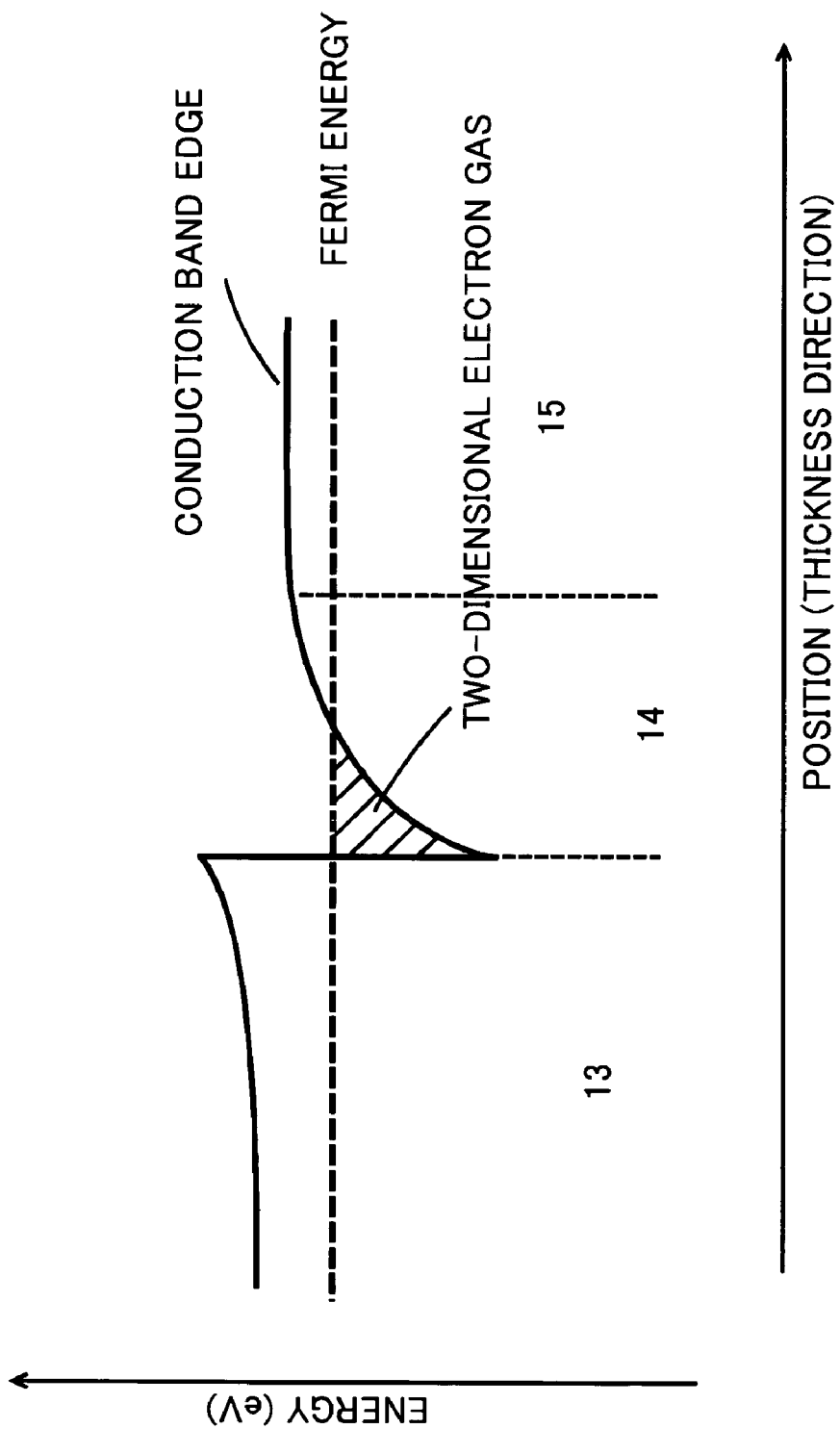
FIG. 3 is an exemplary graph showing the energy profile in an electron gas layer.

FIG. 3 is an exemplary illustrations of an energy profile of the electron gas layer 14, and in particular, shows the energy profile near the conduction band edge. In the figure, the vertical axis indicates the energy, and the horizontal axis indicates the position in the thickness direction within the white-light light-emitting diode 10. Focusing on the horizontal axis, it is seen that the electron gas layer 14 is enclosed between the lower buffer layer 13 and the upper first contact layer 15. In the figure, the conduction band edge is indicated by a solid line, and the Fermi energy is shown as a dashed line.

A comparatively large band offset exists between the conduction band edges of the buffer layer 13 and the electron gas layer 14. The buffer layer 13 and the electron gas layer 14 configure the AlGaN/GaN heterostructure. In the region in the electron gas layer 14 in proximity to the interface with the buffer layer 13, the conduction band edge is lower than the Fermi energy. In the region in which the conduction band edge is lower than the Fermi energy, an electron gas can be accumulated in the conduction band. Because the region in which the conduction band edge is lower than the Fermi energy is distributed over a two-dimensional region along the junction interface between the buffer layer 13 and the electron gas layer 14, a two-dimensional electron gas layer can be formed.

The electron gas layer 14 in which the two-dimensional electron gas layer is formed has an impurity concentration below $10^6$ cm$^{-3}$, and effectively has no intermixed impurities, so that the electron gas can move without being scattered by impurities. The electron gas thus has extremely high mobility. Electrons can be transported at high speed within the two-dimensional electron gas layer. For example, when the molar ratio of AlN in the buffer layer 13 is 25%, the two-dimensional electron gas has a mobility exceeding 1000 cm$^2$/Vs. The thickness of the region in which the two-dimensional electron gas is accumulated is extremely thin, but the electron mobility is approximately ten times greater than that in the first contact layer 15. Therefore the sheet resistance can be more effectively suppressed than by increasing the thickness of the first contact layer 15.

According to the two-dimensional electron gas, a sheet resistance can be obtained similar to that resulting when the thickness of the first contact layer 15 is increased by 1 μm. Hence by accumulating a two-dimensional electron gas, the total thickness of the semiconductor layers 12, 13, 14, 15, 16, 17, 18, 19 and 20 layered on the SiC fluorescent substrate 11 can be reduced. The total thickness can be held to below 3.5 μm. By setting the total thickness of the semiconductor layers 12, 13, 14, 15, 16, 17, 18, 19 and 20 to below 3.5 μm, the possibility of cracks can be greatly decreased, and so the white-light light-emitting diode 10 can easily be increased in size. Of course, even when the white-light light-emitting diode 10 is increased in size, uniform light emission can be maintained.

(3) Light Emission of a White-Light Light-Emitting Diode

When a forward-direction voltage is applied across the p electrode 21 and n electrode 22 of the white-light light-emitting diode 10 formed as described above, a current flows through the semiconductor layers 14, 15, 16, 17, 18, 19 and 20 intervening between the p electrode 21 and n electrode 22. As stated above, a two-dimensional electron gas is accumulated in the electron gas layer 14, and so a current can flow uniformly in directions along the electron gas layer 14. Hence a uniform current can also be supplied to the multiple quantum well active layer 17 layered parallel to the electron gas layer 14. Consequently, the multiple quantum well active layer 17 can emit light uniformly. The multiple quantum well active layer 17 corresponds to the light emission layer of this invention. In the multiple quantum well active layer 17, non-limiting exemplary near-ultraviolet light of wavelength 390 nm is emitted. The emitted near-ultraviolet light is incident on the SiC fluorescent substrate 11 and SiC fluorescent layer 12 doped with acceptor impurities and donor impurities. And the emitted near-ultraviolet light excites these layers.

In the SiC fluorescent substrate 11 and SiC fluorescent layer 12 in an excited state, recombination of donor electrons and acceptor holes occurs. And at this time fluorescent light is emitted to the outside. The wavelengths of this fluorescent light depend on the difference between the acceptor level and donor level in the SiC fluorescent substrate 11 and SiC fluorescent layer 12, and so fluorescent light of different wavelengths is emitted from the SiC fluorescent substrate 11 and from the SiC fluorescent layer 12, which have boron and aluminum acceptor levels respectively.

Specifically, in the SiC fluorescent substrate 11, fluorescent light having a broad wavelength spectrum extending from green to red can be output. And in the SiC fluorescent layer 12, fluorescent light having a broad wavelength spectrum extending from blue to green can be output. A light combined these two types of fluorescent light can be output from the white-light light-emitting diode 10. These fluorescent light components have a complementary relation that the color phase angles inverted by 180°. Therefore by combining these fluorescent light components, white fluorescent light can be obtained. Because each of the fluorescent light components comprises a wavelength spectrum extending over a broad range, the combined white fluorescent light can obtain an excellent color rendering. The white-light light-emitting diode 10 can be suitable for use in illumination and similar. As explained above, the multiple quantum well active layer 17 emits light uniformly, and so the white fluorescent light can also be uniform.

In this embodiment, an example of a white-light light-emitting diode 10 which generates white fluorescent light by means of a SiC fluorescent substrate 11 and SiC fluorescent layer 12 was explained. But a two-dimensional electron gas may be employed in a light-emitting diode which generates fluorescent light in other colors as well. Moreover, uniform emitted light can be obtained even when the two-dimensional electron gas layer is formed in a light-emitting diode which extracts light emitted by the light emission layer to the outside without conversion into fluorescent light. For example, in a red-light light-emitting diode utilizing an AlGaAs semiconductor in the light emission layer, by forming a two-dimensional electron gas layer, uniform red light can be output to the outside.

Further, a two-dimensional electron gas layer may be formed on other types of substrate. However, when GaN is layered as the electron gas layer 14 as in this embodiment, it is desirable that a SiC crystal substrate is employed. This is because SiC crystals have a thermal expansion coefficient lower than that of GaN crystals, and so the occurrence of cracks in the electron gas layer 14 can be prevented.

(4) Second Embodiment

Figure 4:
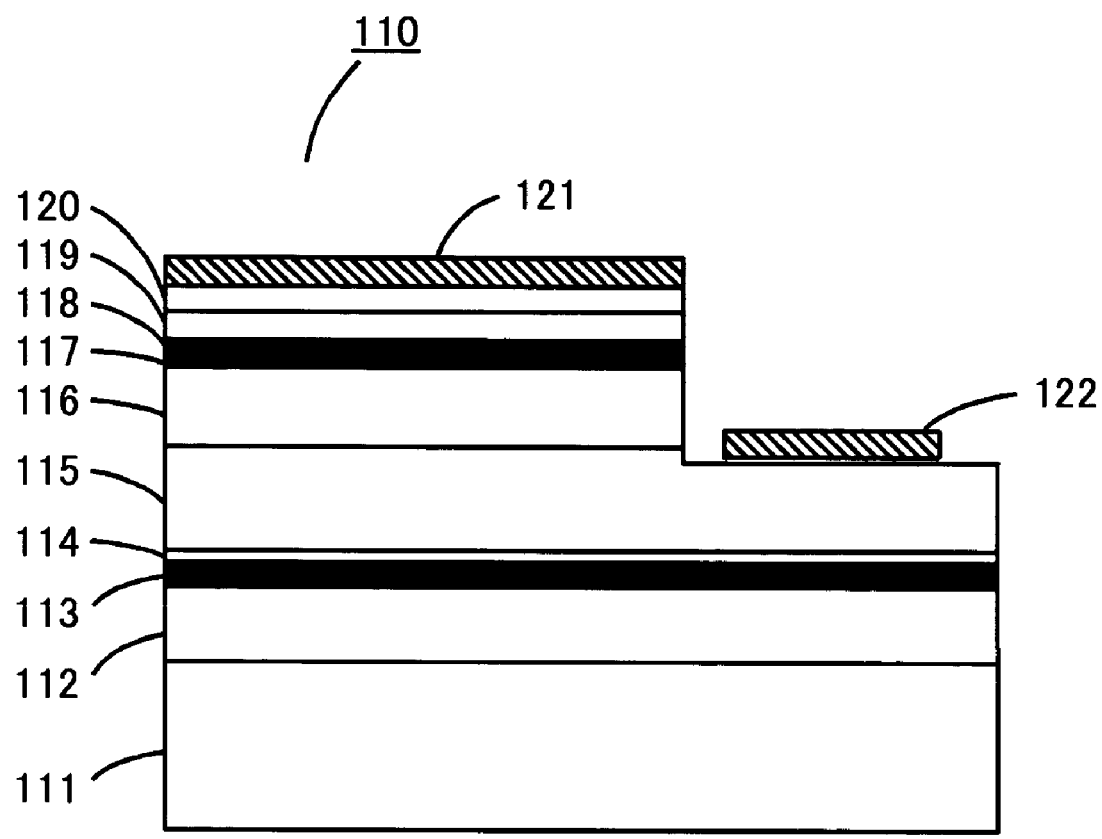
FIG. 4 is an exemplary schematic diagram showing the structure of a light-emitting diode of a second embodiment.

FIG. 4 schematically shows an exemplary structure of the white-light light-emitting diode of a second embodiment. In the figure, similarly to the first embodiment, the white-light light-emitting diode 110 comprises a SiC fluorescent substrate 111; SiC fluorescent layer 112; buffer layer 113; electron gas layer 114; first contact layer 115; first cladding layer 116; multiple quantum well active layer 117; electron blocking layer 118; second cladding layer 119; second contact layer 120; p electrode 121; and n electrode 122. The white-light light-emitting diode 110 can be fabricated by essentially the same fabrication method as in the first embodiment.

Figure 5:
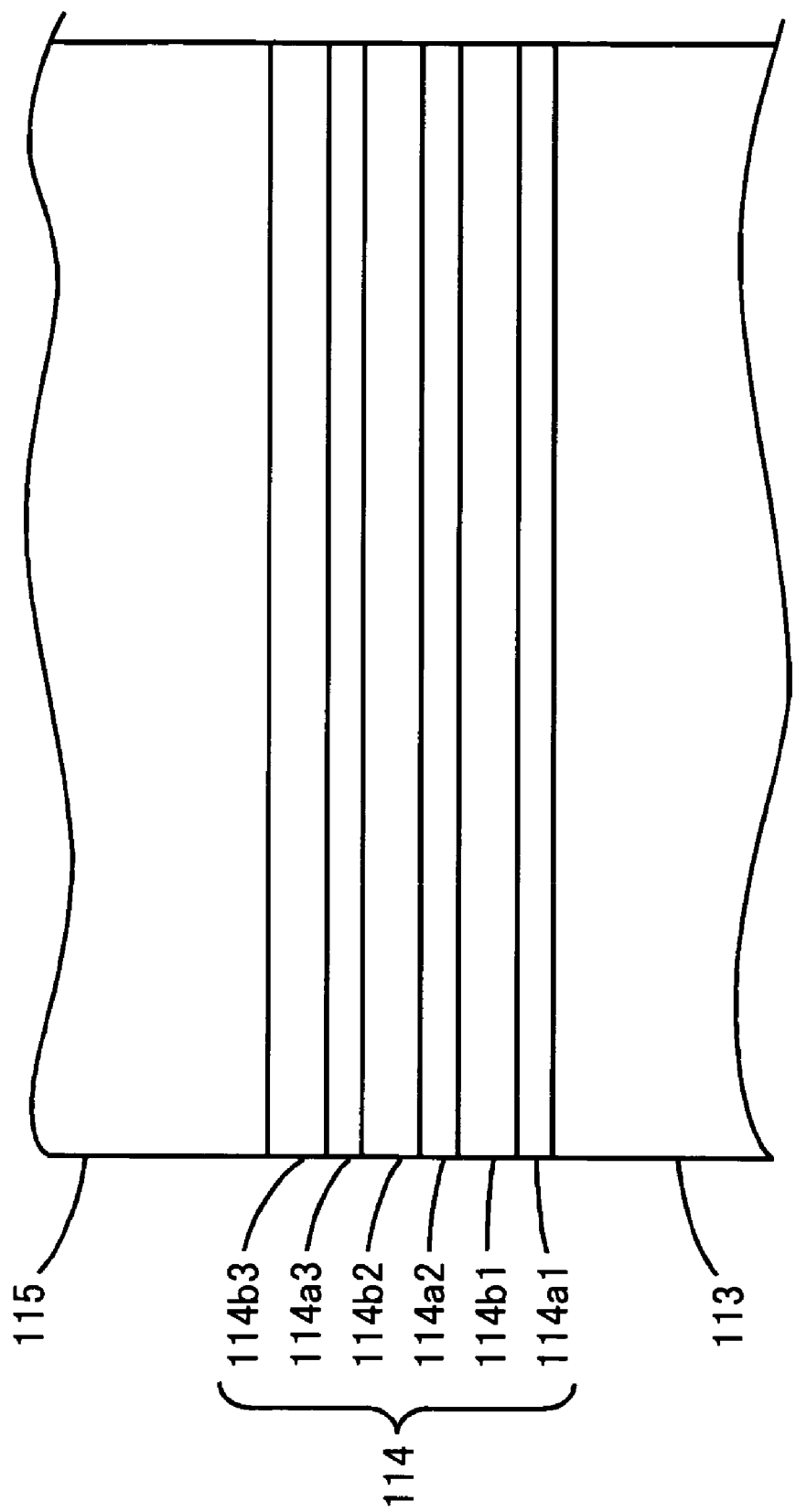
FIG. 5 is an exemplary schematic diagram showing the structure of an electron gas layer; and, FIG. 6 is an exemplary graph showing the energy profile in an electron gas layer.

However, the configuration of the electron gas layer 114 differs from that of the first embodiment. An exemplary structure is shown schematically in FIG. 5. In the figure, the electron gas layer 114 comprises well layers 114a1, 114a2 and 114a3 comprising GaN, and barrier layers 114b1, 114b2 and 114b3 comprising AlGaN. These layers 114a1, 114a2, 114a3, 114b1, 114b2 and 114b3 are placed in alternation in the thickness direction to form three periods of a periodic structure. When forming this periodic structure, for example, a metallorganic vapor phase growth method may be used to grow GaN and AlGaN in alternation.

Figure 6:
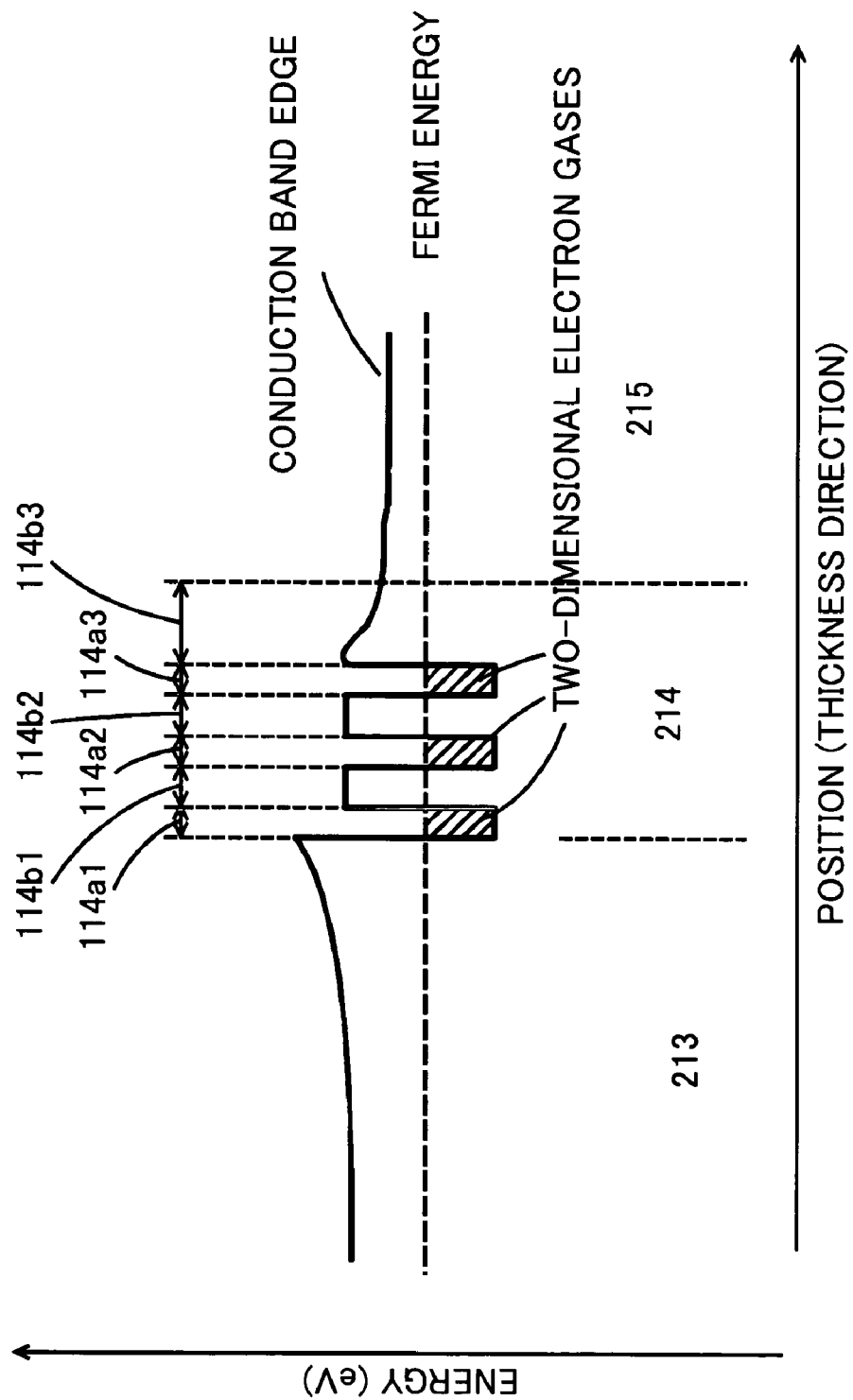

FIG. 6 shows the energy profile of the electron gas layer 114, and in particular, shows the energy profile near the conduction band edge. In the figure, the vertical axis indicates the energy, and the horizontal axis indicates the position in the thickness direction within the white-light light-emitting diode 110. Focusing on the horizontal axis, it is seen that the electron gas layer 114 is enclosed between the lower buffer layer 113 and the upper first contact layer 115. In the figure, the conduction band edge is indicated by a solid line, and the Fermi energy is shown as a dashed line.

As in the first embodiment, comparatively large band offset between conduction band edges exists at the interface between the buffer layer 113 and the well layer 114a1 comprised in GaN and AlGaN. Further, comparatively large conduction band edge band offsets exists at the interface between the barrier layer 114b1 the well layer 114a2, and at the interface between the barrier layer 114b2 and the well layer 114a3. At each of these interfaces the lowered conduction band edge is lower than the Fermi energy, and in each region in which the conduction band edge is below the Fermi energy, an electron gas can be accumulated. By this means, two-dimensional electron gas layers can be formed in three layers.

In this embodiment, the total thickness of the regions in which the conduction band edge is lower than the Fermi energy is approximately 0.2 μm. By thus forming a plurality of two-dimensional electron gas layers, the total thickness of the two-dimensional electron gas layers can be made thick. As stated above, in the two-dimensional electron gas layers an extremely low current resistance can be realized, and so by increasing the total thickness of the two-dimensional electron gas layers, the current resistance can be lowered dramatically.

By setting the total thickness of the two-dimensional electron gas layers to approximately 0.2 μm as in this embodiment, the same current resistance as when the first contact layer 115 is increased in thickness by 2 μm can be obtained. Hence the total thickness of the semiconductor layers 112 to 120 can be decreased compared with the first embodiment, and the possibility of cracks can be further reduced, so that the white-light light-emitting diode 110 can be further increased in size. Of course, uniform light emission can be achieved even when the white-light light-emitting diode 110 is increased in size, enabling use in illumination lamps.

As explained above, a buffer layer 13 and electron gas layer 14 are formed as an AlGaN/GaN heterostructure having a large energy gap at conduction band edges. An electron gas can be accumulated in the region of the interface between the buffer layer 13 and the electron gas layer 14 in which the conduction band edge is lower than the Fermi energy. This electron gas is distributed in the two-dimensional region along the junction interface between the buffer layer 13 and the electron gas layer 14, so that a two-dimensional electron gas layer can be formed. The electron gas has extremely high mobility, and electrons can be transported at high speed in the two-dimensional electron gas layer so as to enable uniform supply of current to the light emission face.

Although the invention has been described in considerable detail in language specific to structural features and or method acts, it is to be understood that the invention defined in the appended claims is not necessarily limited to the specific features or acts described. Rather, the specific features and acts are disclosed as preferred forms of implementing the claimed invention. Therefore, while exemplary illustrative embodiments of the invention have been described, numerous variations and alternative embodiments will occur to those skilled in the art. Such variations and alternate embodiments are contemplated, and can be made without departing from the spirit and scope of the invention.

It is to be understood that the phraseology and terminology employed herein, as well as the abstract, are for the purpose of description and should not be regarded as limiting.

It should further be noted that throughout the entire disclosure, the labels such as left, right, front, back, top, bottom, forward, reverse, clockwise, counter clockwise, up, down, or other similar terms such as upper, lower, aft, fore, vertical, horizontal, proximal, distal, etc. have been used for convenience purposes only and are not intended to imply any particular fixed direction or orientation. Instead, they are used to reflect relative locations and/or directions/orientations between various portions of an object.

In addition, reference to "first," "second," "third," and etc. members throughout the disclosure (and in particular, claims) is not used to show a serial or numerical limitation but instead is used to distinguish or identify the various members of the group.

What is claimed is:

1. A semiconductor device, comprising:
   a substrate comprised of SiC;
   a first contact layer arranged parallel to the substrate;
   a p electrode on the first contact layer;
   a second contact layer arranged parallel between the substrate and the first contact layer;
   an n electrode on the second contact layer;
   one or more luminescent layers arranged parallel between the first contact layer and the second contact layer;
   one or more electron gas layers with two-dimensional electron gases that are distributed parallel to the luminescent layers; and
   a buffer layer comprised of AlGaN with a molar ratio of AlN in the buffer layer of at least 25%, with the buffer layer coupled to the substrate;
   the one or more electron gas layers are comprised of GaN adjacent the AlGaN buffer layer;
   one of the one or more electron gas layers is coupled to the AlGaN buffer layer to accumulate the two-dimensional electron gas within an interface to the AlGaN buffer layer, with the one or more two-dimensional electron gas layers effectively having no intermixed impurities, enabling the two dimensional electron gases to have extremely high mobility without being scattered by impurities.

2. A semiconductor as set forth in claim 1, wherein:
   the one or more luminescent layers are comprised of a nitride.

3. A semiconductor as set forth in claim 1, wherein:
   the one or more electron gas layers are comprised of an AlGaN/GaN hetero structure;

with the AlGaN/GaN hetero structure including well layers each comprised of GaN and the barrier layers each comprised of AlGaN alternately arranged to form a plurality of two-dimensional electron gas layers.

4. A semiconductor as set forth in claim 3, wherein:
a concentration of impurities in the AlGaN/GaN hetero structure is smaller than $10^{16}$ cm$^{-3}$.

5. A semiconductor as set forth in claim 1, wherein:
two or more of the electron gas layers are layered.

6. A semiconductor as set forth in claim 1, wherein:
the one or more luminescent layers and the one or more electron gas layers are layered on an SiC substrate.

7. A semiconductor as set forth in claim 6, wherein:
a total thickness of semiconductor layers layered on the SiC substrate including the one or more luminescent layers and the one or more electron gas layers is approximately 0.2 micro-meter.

8. A semiconductor as set forth in claim 7, wherein:
the SiC substrate includes one or more couples of an acceptor impurity and a donor impurity.

* * * * *